(12) United States Patent
Adams et al.

(10) Patent No.: US 7,203,873 B1
(45) Date of Patent: Apr. 10, 2007

(54) ASYNCHRONOUS CONTROL OF MEMORY SELF TEST

(75) Inventors: R. Dean Adams, St. George, VT (US); Robert Abbott, Ottawa (CA); Xiaoliang Bai, La Jolla, CA (US); Dwayne M. Burek, San Jose, CA (US)

(73) Assignee: Magma Design Automation, Inc., Santa Clara, CA (US)

( * ) Notice: Subject to any disclaimer, the term of this patent is extended or adjusted under 35 U.S.C. 154(b) by 274 days.

(21) Appl. No.: 10/861,247

(22) Filed: Jun. 4, 2004

(51) Int. Cl.
*G11C 29/00* (2006.01)
(52) U.S. Cl. ............... 714/718; 714/733; 714/31
(58) Field of Classification Search ............... None
See application file for complete search history.

(56) References Cited

U.S. PATENT DOCUMENTS

| | | | |
|---|---|---|---|
| 4,603,404 A | 7/1986 | Yamauchi et al. | |
| 4,751,656 A | 6/1988 | Conti et al. | |
| 5,173,906 A | 12/1992 | Dreibelbis et al. | |
| 5,313,424 A | 5/1994 | Adams et al. | |
| 5,337,318 A | 8/1994 | Tsukakoshi et al. | |
| 5,535,164 A | 7/1996 | Adams et al. | |
| 5,764,878 A | 6/1998 | Kablanian et al. | |
| 5,784,323 A | 7/1998 | Adams et al. | |
| 5,796,745 A | 8/1998 | Adams et al. | |
| 5,812,469 A | 9/1998 | Nadeau-Dostie et al. | |
| 5,912,901 A | 6/1999 | Adams et al. | |
| 5,961,653 A | 10/1999 | Kalter et al. | |
| 6,026,505 A | 2/2000 | Hederg et al. | |
| 6,070,256 A | 5/2000 | Wu et al. | |
| 6,073,258 A | 6/2000 | Wheater | |
| 6,085,334 A | 7/2000 | Giles et al. | |
| 6,255,836 B1 | 7/2001 | Schwarz et al. | |
| 6,256,757 B1 | 7/2001 | Arkin | |
| 6,259,637 B1 | 7/2001 | Wood et al. | |
| 6,304,989 B1 | 10/2001 | Kraus et al. | |
| 6,373,758 B1 | 4/2002 | Hughes et al. | |
| 6,594,788 B1 | 7/2003 | Yasui | |

(Continued)

FOREIGN PATENT DOCUMENTS

EP     1343173 A1     9/2003

(Continued)

OTHER PUBLICATIONS

Fang et al., "Power-Constrained Embedded Memory BIST Architecture", Nov. 5, 2003, IEEE Symposium on Defect and Fault Tolerance, pp. 451-458.*

(Continued)

*Primary Examiner*—Albert Decady
*Assistant Examiner*—John P. Trimmings
(74) *Attorney, Agent, or Firm*—Fenwick & West LLP

(57) ABSTRACT

A memory logic built-in self-test ("BIST") includes slow speed controller-to-collar signals, while allowing collars to test memories at full speed. A controller is configured to include control features and address, data, read/write, output evaluation, and redundancy calculation values are configured within the collars. The controller is further configured to handle scheduling of the collars and diagnostics interfacing. In addition, the collars are configured to allow BIST testing to be run serially, in parallel, or in groups. Collars are also configured to send diagnostic results back to the controller based on the initialization of the respective collars, thus providing a central interface for the diagnostics results.

22 Claims, 6 Drawing Sheets

U.S. PATENT DOCUMENTS

| | | | |
|---|---|---|---|
| 6,643,807 B1* | 11/2003 | Heaslip et al. | 714/719 |
| 6,668,347 B1 | 12/2003 | Babella et al. | |
| 6,694,461 B1* | 2/2004 | Treuer | 714/719 |
| 6,795,942 B1 | 9/2004 | Schwarz | |
| 6,907,554 B2 | 6/2005 | Adams et al. | |
| 2002/0114202 A1 | 8/2002 | Adams et al. | |
| 2003/0074616 A1* | 4/2003 | Dorsey | 714/733 |
| 2003/0120974 A1* | 6/2003 | Adams et al. | 714/31 |
| 2003/0167427 A1* | 9/2003 | Kraus et al. | 714/718 |
| 2004/0199843 A1* | 10/2004 | Hansquine et al. | 714/733 |
| 2005/0257109 A1* | 11/2005 | Averbuj et al. | 714/733 |

FOREIGN PATENT DOCUMENTS

| | | |
|---|---|---|
| EP | 1343174 A2 | 9/2003 |
| WO | WO 01/67463 A1 | 3/2001 |
| WO | WO 02/065291 A2 | 8/2002 |

OTHER PUBLICATIONS

Benso et al., "Programmable Built-In Self-Testing of Embedded RAM Clusters in System-On-Chip Architectures", Sep. 2003, IEEE Communications Magazine, pp. 90-97.*

"Built-In Self-Test (BIST) Using Boundary Scan," Texas Instruments, Dec. 1996, 21 pages.

Koscianski, M., "Built-In Self Test Insertion In A System On A Chip," ETW 2000, May 2000, Silicon & Software Systems, pp. 1-19.

Wu, Cheng-Wen, "Memory Built-In Self-Test," National Tsing Hua University, 33 pages.

Dekker, R. et al., "A Realistic Self-Test Machine for Static Random Access Memories," 1988 International Test Conference, IEEE, 1988, pp. 353-361.

Hamdioui, S. et al., "Mar. SS: A Test for all Static Simple RAM Faults," Proceedings of the 2002 IEEE International Workshop on Memory Technology, Design and Testing (MTDT 2002), IEEE, 2002, 6 pages.

Koike, H. et al., "A BIST Scheme-Using Microprogram ROM for Large Capacity Memories," 1990 International Test Conference, IEEE, 1990, pp. 815-822.

Nagura, Y. et al., "Test Cost Reduction by At-Speed BISR for Embedded DRAMs," ITC International Test Conference, IEEE, 2001, pp. 182-187.

van de Goor, A. et al., "Industrial Evaluation of DRAM SIMM Tests," ITC International Test Conference, IEEE, 2000, pp. 426-435.

U.S. Appl. No. 10/668,651, filed Sep. 23, 2003, Adams et al.

Aitken, R., "Applying Defect-Based Test to Embedded Memories in a COT Model," Proceedings IEEE Memory Technology Design and Test Workshop, 2003, pp. 1-6.

Borri, S. et al., "Defect-Oriented Dynamic Fault Models for Embedded-SRAMs," 6 pages.

Koren, I. et al., "Fault Tolerance in VLSI Circuits," Computer, IEEE, Jul. 1990, pp. 73-83.

Powell, T.J. et al., "BIST for Deep Submicron ASIC Memories with High Performance Application," ITC International Test Conference, IEEE, 2003, p.386-392.

* cited by examiner

ASYNCHRONOUS CONTROL OF MEMORY SELF TEST

CROSS REFERENCE TO RELATED APPLICATIONS

This application relates to U.S. patent application Ser. No. 10/862,135, titled "At Speed Bit Fail Mapping Without Need for Pipelining," (Inventors: R Dean Adams, Robert A. Abbott, Xiaoliang Bai, and Dwayne M. Burek), filed Jun. 4, 2004, which is also assigned to the same assignee as the present application, and the contents of which are hereby incorporated by reference.

BACKGROUND OF THE INVENTION

1. Field of the Invention

The present invention generally relates to the field of testing integrated circuit chips, and more specifically, to testing memory logic on an integrated circuit.

2. Description of the Related Art

Embedded memories require the utilization of built-in self-test ("BIST") to evaluate whether they are good, i.e., operational, and to perform needed redundancy calculations. Conventional BIST systems have typically been separated into a controller and a collar (or wrapper). In convention integrated circuit chip designs the collar is close to the memory, while the controller is remote from the collar and shared by a number of collars. In these conventional designs, the idea is to place dedicated resources in the collars and place shared logic in the controller.

A problem with conventional BIST system approaches is that dedicated high-speed interface lines are required between the controller and each collar. Because the controller is geographically remote from the collars, circuit timing becomes a challenge. Unfortunately, these challenges translate to increased design cycle times and increased design complexities to ensure circuit timing needs are met.

Another problem with a conventional BIST system has to do with memories that reside in different clock domains. When memories reside in different clock domains, a conventional BIST system requires a minimum of one controller per clock domain. Due to the high-speed interface as described above, the physical proximity of the controller to collared memories must be taken into account. Specifically, systems are required to have more than one controller required per clock domain. In turn, this causes additional challenges for planning the insertion of a conventional BIST because it must consider the clock domains for the memory to be tested as well as the physical locations of the memory within the layout of the device. Both result in increased design cycle time and expense.

Yet another problem with conventional BIST systems is limited information available to the tester with respect to integrated circuit chip operational failures. Conventional BIST systems do diagnose failures, when present, within a chip. However, such systems are unable to provide information on what specifically failed within the integrated circuit chip.

Therefore, in view of the above, there is a need for a system and process to test memory logic in an integrated circuit chip design that includes scheduling and diagnostics for memory logic testing and provides information on failure specifications.

SUMMARY OF THE INVENTION

The present invention includes systems and methods for performing a built-in self-test ("BIST") for memories in an integrated circuit chip. In one embodiment, a configuration for BIST testing includes two or more memories and a controller. A collar surrounds each memory with associated testing logic for that memory ("collared memory"). In addition, the present systems and methods are functional with at least two different memory types.

The controller is configured to control testing of the two or more collared memories during BIST. The controller includes a scheduling element, a diagnostic element, and an enable element. The scheduling element is configured to allow testing of two or more collared memories that are coupled with the controller through one or more steps. In general, within a step a single collar can be enabled per step, a group of collars can be enabled per step, or all collars can be enabled per step. When all collars per step have completed execution the next group of collars is enabled for execution.

The diagnostic element is configured to determine whether a memory in the testing set of the two or more memories failed, and if there is a failure, what specifically failed. The enable element is configured to selectively enable a collared memory for testing, e.g., one at a time. In addition, multiple collared memories can be scheduled and tested simultaneously as well as in batch mode (several memories as one set) and serial mode (one by one).

Functions in the controller are derived from a test clock. The test clock is configured to operate at a slower speed than a system clock. In one embodiment, signals from the system clock are 50 to 100 times faster than signals from the test clock. Also noted, in one embodiment signals between the collars and controller are at slower speeds (relative to the system clock speed) although the collars themselves operate at system clock speed (operational or functional speed).

The present systems and methods allow for using one controller to run and manage BIST for all memory types rather than having multiple controllers, one for each specific type of memory. This reduces signal complexity and testing efficiency because controller interfaces are consolidated and standardized. Moreover, by reducing the number of controllers, the number of wires necessary to connect each controller with collars for different type of memories is also significantly reduced. This improves chip timing.

In addition, by moving memory testing logic elements closer to the memory and having those components operate at system clock speeds while allowing the controller to operate at test clock speed, there is a significant improvement in detecting subtle failures which will occur only when memory runs at functional speed. Further, while wire delay keeps increasing and surpassing logic delay in conventional nanometer technology circuits, problems of wire delays in traditional controller/collar design are avoided as well as problems involving signal integrity (e.g., crosstalk between signals) introduced by long wires. Therefore, the present systems and methods improve overall quality of design and manufacturing test. Yet another advantage is simplification of planning for BIST insertion because consideration for clock domains and layouts are no longer necessary.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

The Figures ("FIG.") and the following description relate to preferred embodiments of the present invention by way of illustration only. Embodiments of the present include structures and processes in an integrated circuit chip built-in self-test ("BIST") environment for testing memories of differing (or varying) types with a universal BIST controller. The present invention may be used with any BIST environment, including IEEE 1149.1 JTAG boundary scans.

Overview of a BIST Environment

Figure 1:
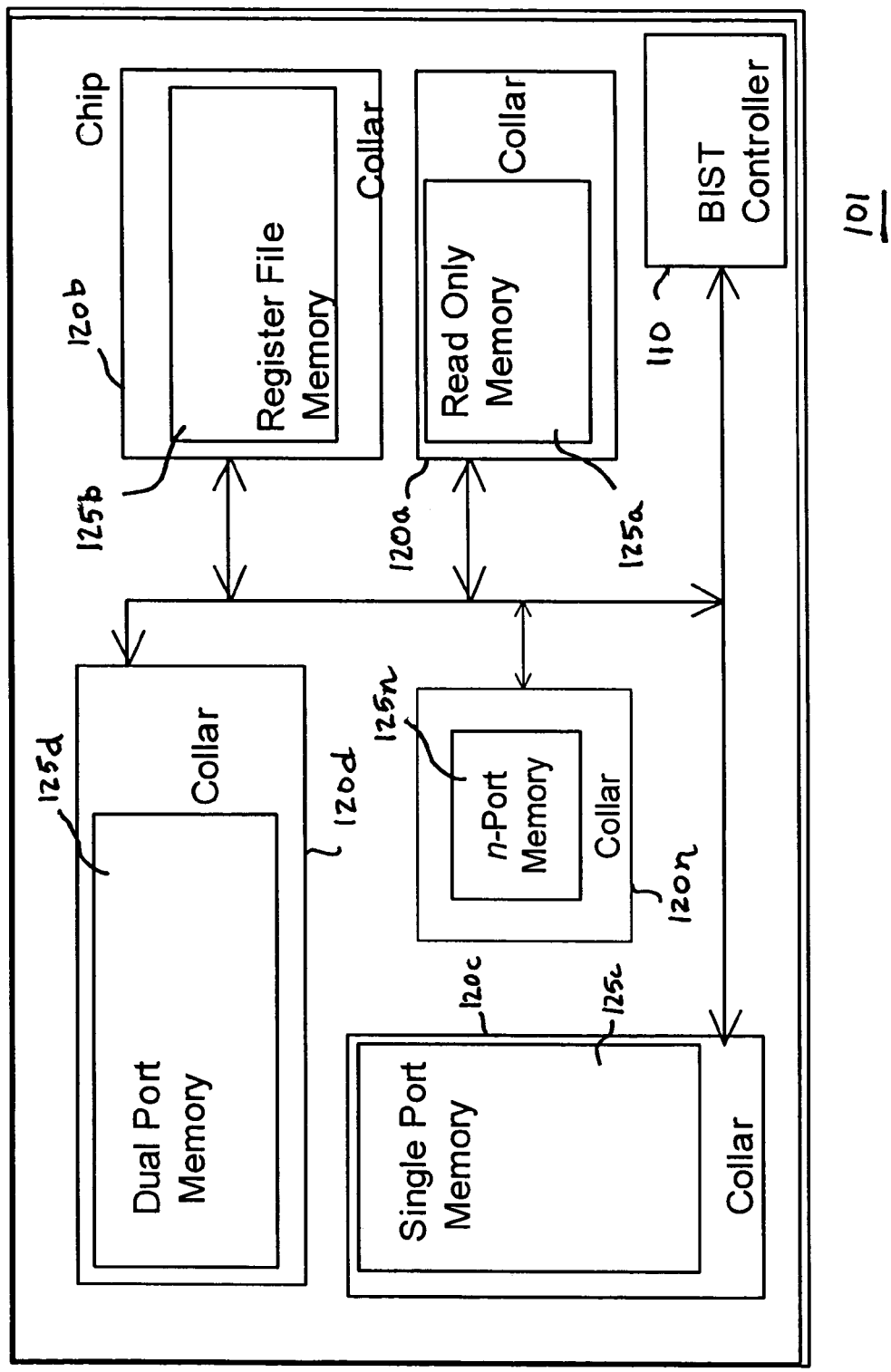
FIG. 1 illustrates an embodiment of an integrated circuit chip memory built-in self-test ("BIST") environment including a universal BIST controller and multiple memory types, each with associated collar in accordance with the present invention.

FIG. 1 illustrates an embodiment of an integrated circuit chip BIST environment 101 including a universal BIST controller 10 and multiple memory types 125a–n (generally 125), each with associated collar 120a–n (generally 120), where n is any integer value, in accordance with the present invention. The BIST environment 101 includes one instance of the universal BIST controller 110 that bi-directionally communicates with and functions with any memory type in the BIST environment 101 through the memory's associated collar 120. The memory types may be the same or differing (varying), for example, a read only memory 125a, a register file memory 125b, a single port memory 125c, a dual port memory 125d, and/or an n-port memory (where n is any integer). Each collar 120 includes logic to interface with the universal BIST controller 110 and memory 125 for testing in the BIST environment.

Figure 2:
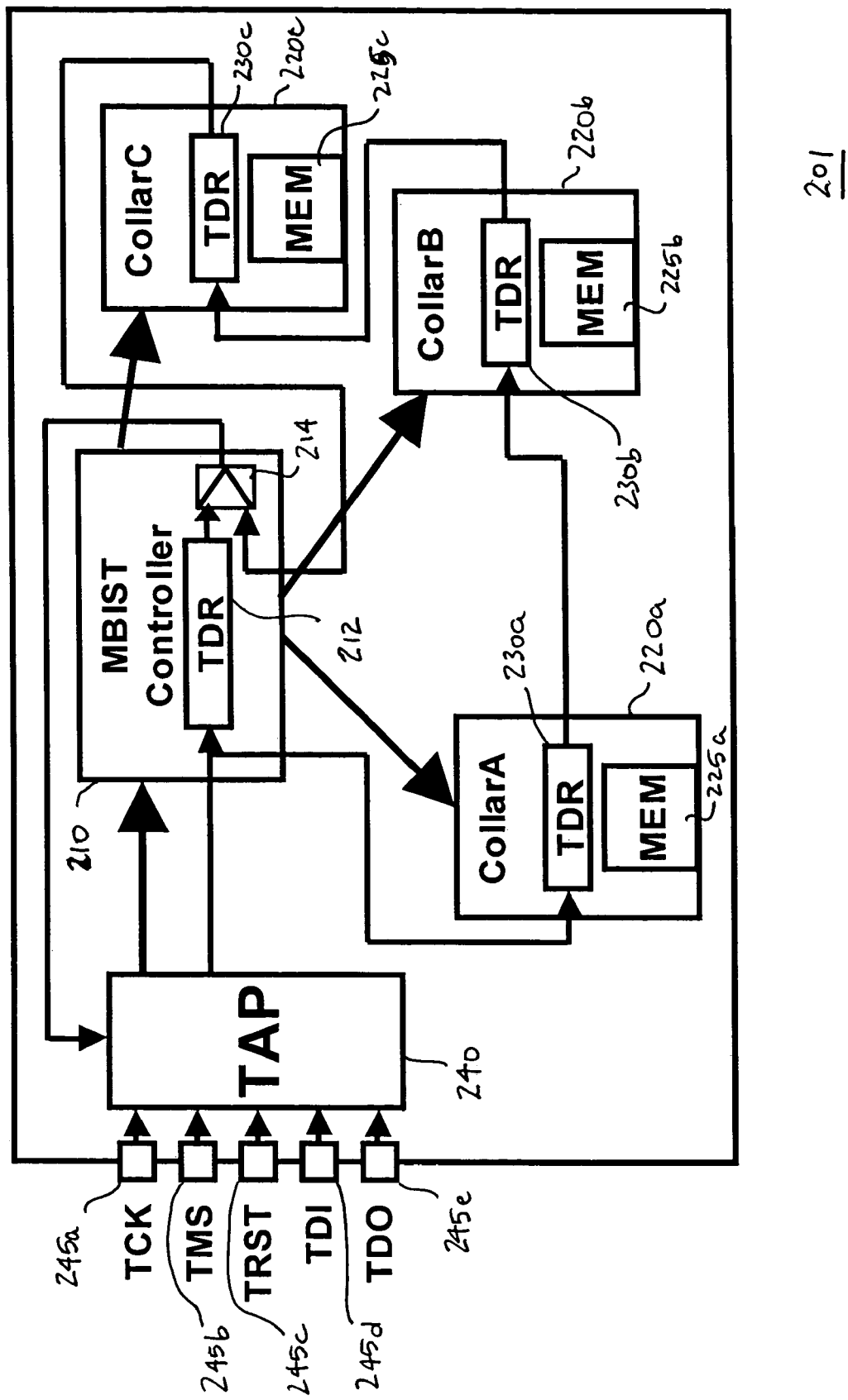
FIG. 2 illustrates a second embodiment of an integrated circuit chip BIST environment including a universal BIST controller, multiple memory types, each with associated collar, and test access ports ("TAP") in accordance with the present invention.

FIG. 2 illustrates a second embodiment of an integrated circuit chip BIST environment 201. The second embodiment of the BIST environment includes a second embodiment of a universal BIST controller 210, one or more memories 225a–c (generally 225), each with associated collar 220a–c (generally 220), and test access port ("TAP") 240 and associated TAP interfaces 245a–e. The universal BIST controller 210 couples with the one or more memories 225 through an appropriate associated collar 220. The universal BIST controller 210 also optionally couples the TAP 240.

The universal BIST controller 210 includes a test data register ("TDR") 212 and multiplexing logic 214. The TDR 212 in the universal BIST controller 210 is configured to include signals to enable and diagnose memories 225 in the BIST environment 201 as well as schedule and enable BIST. Each collar 225 also includes a TDR 230a, 230b, 230c (generally 230). The TDR 212, 230 is conventional and may be configured to hold one or more, bit values corresponding to data and/or command signal for the universal BIST controller 210 or associated collar 225 during the BIST. The multiplexing logic 214 of the universal BIST controller 210 is configured to shift data into the TDRs of the collars 225.

The TAP 240 is conventional and couples with associated TAP interfaces. In the second embodiment of the BIST environment 201, the associated TAP interfaces are conventional and include a test clock ("TCK" or "tck") interface 245a, a test mode select ("TMS" or "tms") interface 245b, test data reset ("TRST" or "trst") interface 245c, test data input ("TDI" or "Tdi") interface 245d, and test data output ("TDO" or "Tdo") interface 245e.

Generally, during BIST, test patterns are input through the TAP interface 245. The internal registers of the conventional TAP 240 are configured to setup the multiplexer 214 to determine whether the TAP interface 245 should access a universal BIST controller's TDR 212 or each collar TDR 230. The results of the BIST are also output through the TAP interface 245.

To configure different test functions or to obtain detailed results of the BIST execution of the universal BIST controller 210, test patterns are input through the TAP interface 245 into the TDR 212 of the universal BIST controller 210. To configure different test functions or to obtain detailed results of the BIST execution of each collar 220, test patterns are input through the TAP interface 245 to each TDR 230 of each collar 220 to test the memory 225 through a process as is further described below. In the configuration of the second embodiment of the BIST environment, as well as the first embodiment, there is one universal BIST controller 210 (110) for use with testing all memories regardless of their type rather than an individual controller for each separate memory type.

Figure 3:
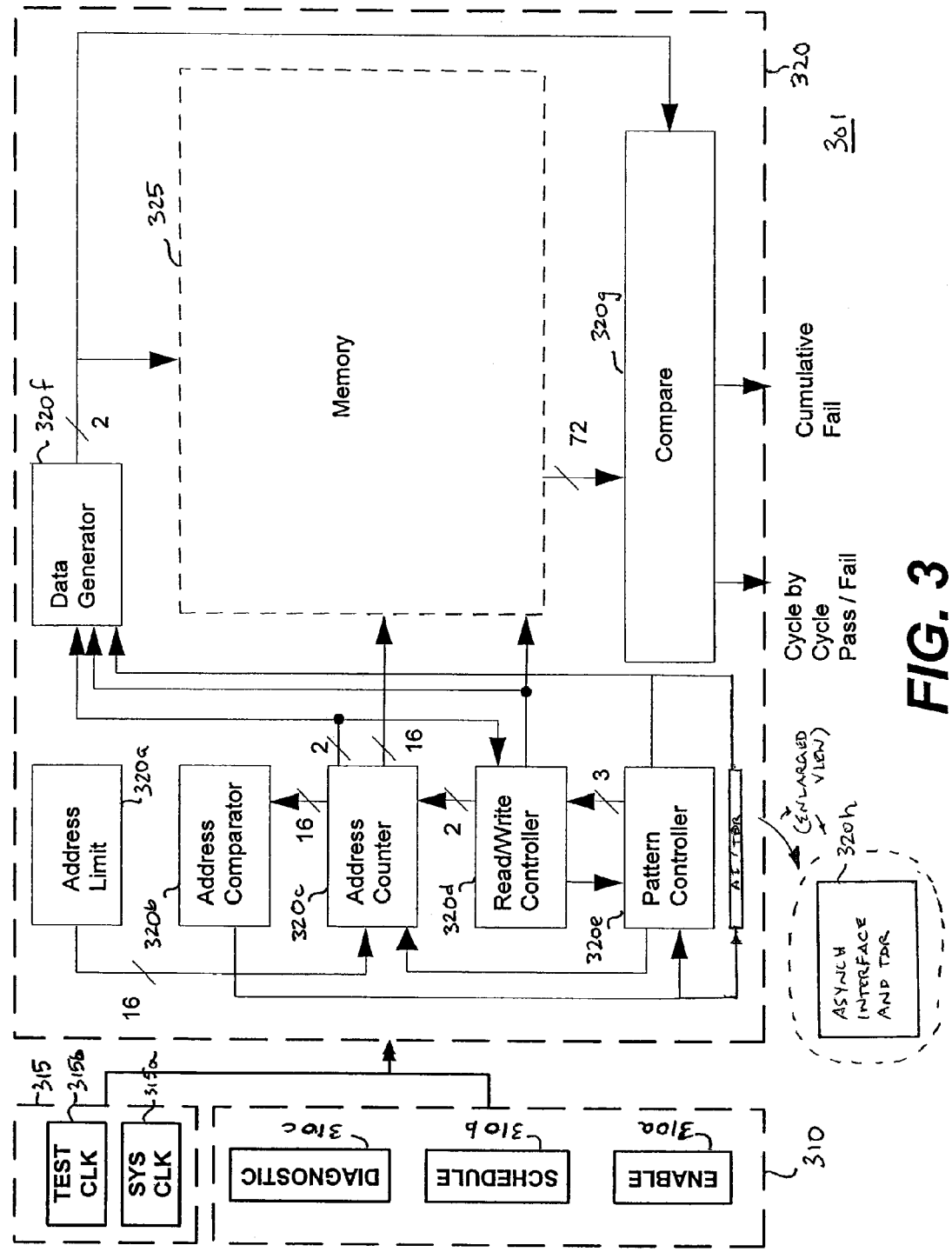
FIG. 3 illustrates a third embodiment of an integrated circuit chip BIST environment comprising a universal BIST controller, clocking system, and memory with associated collar in accordance with the present invention.

FIG. 3 illustrates a third embodiment of an integrated circuit chip BIST environment 301. The third embodiment includes a universal BIST controller 310, a clocking system 315, and a memory 325 with associated collar 320. The universal BIST controller 310 is configured to control testing of the memory 325 in the collar 320. The clocking system 315 provides clock signals for use in operation of the universal BIST controller 310, collars 320, and memories 325.

Referring initially to the clocking system 315 in FIG. 3, it includes a system clock 315a and a test clock 315b. The system clock 315a generates clock signals at a speed at which the integrated circuit chip operates (e.g., operational, functional, chip, or system speed). In one embodiment, the system clock 315a operates at high frequencies, for example, 800 MHz to 1 GHz (or a 1 nanosecond duty cycle).

The test clock is configured to generate clock signals for communications between the universal BIST controller 310 and the collars 320. In one embodiment, the signals from the test clock operate a slower speed relative to the system clock, for example, approximately 10 MHz (or a 100 nanosecond duty cycle). Although test clock signals between the universal BIST controller 310 and the collars 320 are at a slow speed (relative to the system clock signals), the collars 320 (and their memories 325) are configured to perform BIST at operational speed after being enabled by the universal BIST controller 310. Hence, with the controller outputs at test clock speeds and collar inputs at system clock speeds, the environment is asynchronous.

Referring next to the collar 320 in FIG. 3, it includes an asynchronous interface and TDR 320*h* to interface with the universal BIST controller 310 and clocking system 315 to perform BIST for the memory 325. The collar logic includes address logic for testing the memory such as an address limiter 320*a*, an address comparator 320*b*, and an address counter 320*c*. The collar logic also includes a read/write controller 320*d*, a pattern controller 320*e*, a data generator 320*f*, and compare logic 320*g*. It is noted that for ease of discussion that testing (or BIST) may be referenced through collared memories.

When instructed to do so by the universal BIST controller 310, the asynchronous interface and TDR 320*h* initiate execution of the BIST via the pattern controller 320*e*. The pattern controller 320*e* includes logic to control address logic, for example, the address limiter 320*a*, the address comparator 320*b*, and the address counter 320*c*, as well as the read/write controller 320*d*, the pattern controller 320*e*, the data generator 320*f*, and the comparator 320*g*. The pattern controller 320*e* co-ordinates the control of the aforementioned component (blocks) to implement one or more algorithmic test patterns to be applied to the memory 325.

The address counter 320*c* determines the address to be applied to the memory 325 during BIST. The address limiter 320*a* defines the counting range for the address counter 320*c*. The address comparator 320*b* is a feedback to the pattern controller 320*e* and is used to determine the next step within an algorithmic test pattern that is applied to the memory 325 during BIST. In addition to applying an address to the memory 325, the command interface to the memory is controlled by the read/write controller 320*d*. The pattern controller 320*e* instructs the read/write controller 320*d* to perform a memory read command, memory write command, or memory no operation command during memory BIST.

The data generator block 320*f* is configured to generate both data to be applied to the memory 325 and expected data to be read from the memory 325 during memory BIST. To perform this function the data generator 320*f* requires input from the pattern controller 320*e*, read/write controller 320*d*, and the address counter 320*c* to determine the write and expected data. The expected data generated from the data generator 320*f* is input to the compare logic 320*g*. The compare logic 320*g* determines if the expected data from the data generator 320*f* is a match to the read data from the memory 325 when a read command is issued from the read/write controller 320*d*. The output of the compare logic 320*g* is a cumulative fail output and a cycle by cycle pass fail output. The cumulative fail output is asserted logic high for a pass status for the BIST and asserted logic low for a fail status for the BIST.

Additional Embodiments of Universal BIST Controllers

Referring now to the universal BIST controller 310 in FIG. 3, it is shown to include an enable module (or enabler) 310*a*, a scheduling module (or scheduler) 310*b*, and a diagnostic module 310*c*. In addition, the universal BIST controller 310 includes other conventional controller components (not illustrated), for example, a processing unit or state machine, and one or more instruction sets or states, as well as one or more data registers (e.g., functionally similar to the TDR described in FIG. 2) and appropriate inputs and outputs.

Generally, the enable module 310*a* is configured to provide enable signals for use in selecting, scheduling, and controlling BIST of collars 320 (and, therefore, the memory 325 in each collar). In one embodiment, when the universal BIST controller 310 is readied for BIST, signals from the enable module 310*a* are loaded into a TDR in the universal BIST controller 310 for use during BIST. The scheduling module 310 is configured to select a group of memories for testing (i.e., BIST) through establishing an order for which memories, and how many memories, are tested at predetermined intervals. For example, establishing an order includes dividing the memories into one or more sets, each set having one or more memories that are grouped together based on a characteristic such as memory type, power draw, size, and/or other testing constraints.

Figure 4:
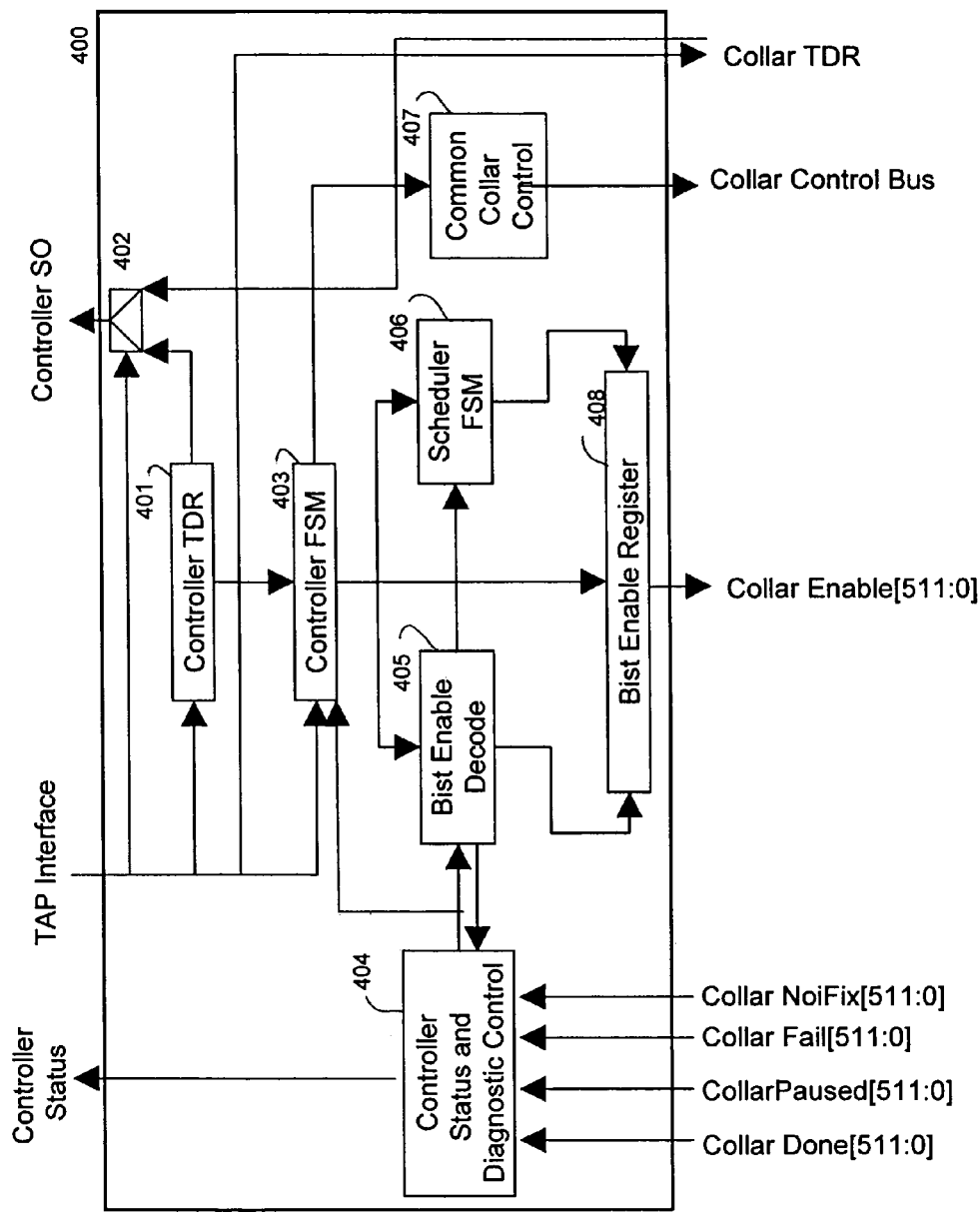
FIG. 4 illustrates an embodiment of a universal BIST controller in accordance with the present invention.

FIG. 4 illustrates another embodiment of the universal BIST controller 400 in accordance with the present invention. In this embodiment, the universal BIST controller 400 includes functionality of the universal BIST controllers previously described, there is a controller TDR 401 (functionally similar to TDR 212 also and further described herein), multiplexing logic 402, a controller finite state machine ("FSM") 403, a controller status and diagnostic logic 404, a BIST enable decode 405, a scheduler FSM 406, a common collar control 407, and a BIST enable register 408.

The controller TDR 401 communicatively couples with a TAP interface, the multiplexing logic 402 and the controller FSM 403. The controller FSM 403 couples with the controller status and diagnostic control 404, the BIST enable decode 405, the scheduler FSM 406, the common collar control 407, and the BIST enable register 408. The controller status and diagnostic control 404 communicatively couples with the BIST enable decode 405 and is also configured to communicate controller status and receive collar related signals. The BIST enable decode 405 communicatively couples the scheduler FSM 406 and the BIST enable register 408. The scheduler FSM 406 also communicatively couples the BIST enable register 408. The BIST enable register 408 communicates collar enable signals with a collar. The common collar control 407 communicates collar control bus signals with a collar. The TAP interface and the multiplexing logic also communicate with a TDR in the collar (e.g. TDR 230).

Reference is now made to an embodiment of operation of the universal BIST controller 400. The TAP interface, e.g., from a conventional TAP, provides an access to the controller TDR 401. Input from the TAP interface into the controller TDR 401 allows specific memories to be enabled and also allows for diagnostic enabling and BIST scheduling. The multiplexing logic 402 is used in conjunction with the TAP interface to determine if the controller TDR 401 is to be scanned through the TAP or if a collar TDR is to be scanned through the TAP.

Referring now to Table 1 below, which may be referenced in conjunction with the BIST environments of FIGS. 2 through 4, it provides descriptions for TDR bit defintions for a universal BIST controller (e.g., 210, 310, 400). It is noted that the table is structured using an example embodiment in which the universal BIST controller is configured for coupling 512 collars.

TABLE 1

TDR Bit Definitions

| Bit No. | Function | Note: | Status: |
|---|---|---|---|
| 1 | Serialize Encode value 0 | All zeros encode condition indicates all 512 collars in parallel. | Ctlr_Failed |
| 2 | Serialize Encode value 1 | A "1" value indicates to serially run 2 groups of 256 collars in parallel. | Ctlr_NoFix |
| 3 | Serialize Encode value 2 | A "2" value indicates to serially run 4 groups of 128 collars in parallel. | Ctrl_Done |
| 4 | Serialize Encode value 3 | A "3" value indicates to serially run 8 groups of 64 collars in parallel. A "4" value indicates to serially run 8 groups of 32 collars in parallel. A "5" value indicates to serially run 32 groups of 16 collars in parallel. A "6" value indicates to serially run 64 groups of 8 collars in parallel. A "7" value indicates to serially run 128 groups of 4 collars in parallel. A "8" value indicates to serially run 256 groups of 2 collars in parallel. A "9" value indicates to serially run all 512 collars. | Ctlr_Paused |
| 5 | Encoded Bist Enable 0 | All zero enable indicates collars are scheduled based on serialize encode values above. A 1 value indicates to enable bist enable 1, a 2 value indicates to enable bist enable 2, . . . , a 512 value indicates to enable bist enable 511. | na |
| 6 | Encoded Bist Enable 1 | | na |
| ... | ... | ... | ... |
| 17 | Encoded Bist Enable 9 | | na |
| 18 | Automatic Diagnostic Enable | | na |

With reference to FIG. 4, the controller TDR 401 provides configuration information for the controller FSM 403. The controller FSM 403 is enabled from the TAP interface and starts execution of the BIST depending on the configuration information provided in the controller TDR 401. If the universal BIST controller 400 is to run in scheduling mode the schedule FSM 406 is enabled and controls the BIST enable register 408. The BIST enable register 408 contains an individual bit for each collar connected to the universal BIST controller 400.

The bit information for the group of collars (e.g., collars 230) to be enabled for BIST is serially shifted into the BIST enables register 408 in schedule mode. If the universal BIST controller 400 is enabling a single collar for BIST, the BIST enable decode 405 decodes the data from the controller TDR 401. The controller FSM 403 also controls the common collar control 407, which constitutes a series of signals for specifying the mode of execution and collar TDR control signals. Upon completion of a collar BIST the status signals done (Done), paused (Paused), fail (Fail), and no fix (NoFix) are returned to the controller status and diagnostic control logic 404. Note that in some embodiments each collar may only return a subset of these signals depending on the memory type that the collar is testing.

The controller status and diagnostic control logic 404 is used in the schedule mode of operation to determine when the scheduling step is completed and indicates this to the controller FSM 404 such that the next scheduling group can be shifted in the to BIST enable register 408 by the scheduler FSM 406. The controller status and diagnostic control logic 404 also provides a comprehensive status to the TAP and the controller TDR 401 to indicate an overall status of all collar BIST execution.

Tables 2 and 3, shown below, respectively describe inputs and outputs of the universal BIST controller (e.g., 210, 310, 400) in response to BIST operations. A description is also provided thereafter of how the signals in Tables 2 and 3 function in the context of the universal BIST controller in a BIST environment. Again the tables below are with reference to an example embodiment in which the universal BIST controller is configured for coupling 512 collars.

TABLE 2

Inputs

From chip boundary or elsewhere on chip:

tck - Clock for stepping from one enable to the next and for shifting the TDR. (Thus, it is a tck type of clock but must continue to be free running even during BIST execution.)
Tdi
ShiftWR
CaptureWR
UpdateWR
SelectWIR
Shift
Capture
Update
cntlr_enable
cntlr_reset
cntlr_mode(0 . . . 1)
cntlr_resume
cntlr_rtntst From memory collars:

bist_paused(0 . . . 511) - Pause signal indicates that the BIST is paused in a state where retention testing or diagnostics can be performed. There is no paused signal returned from ROMs but rather the bist_done signal from the ROM is attached to the bist_paused input to indicate that the ROM is in a stable state.
bist_fail(0 . . . 511) - The fail signals indicate that the BIST has encountered a fail. Normally the fail signal goes high and stays high once the fail is detected. The fail signal also provide diagnostic fail input to controller on a cycle-by-cycle basis. These signals do not comes back from any ROM - in essence this input will be tied low for a ROM.
bist_nofix(0 . . . 511) - For memories with redundancy this bit indicates that a memory has more fails than can be repaired by the BIST. Normally the fail signal goes high and stays high once the fail is detected. Non-redundant memories would have their bist_fail signal attached to this nofix input as well.
bist_done(0 . . . 511)

TABLE 3

Outputs

To chip boundary or elsewhere on chip:

Tdo
cntlr_paused - This signal represents an AND of the bist_paused signals for all of the enabled memories.
cntlr_done - This signal goes active once all of the memories are completed with testing.
cntlr_fail - This signal represents an OR of the bist_fail signals.
cntlr_nofix - This signal represents an OR of all the bist_nofix signals.

To memory collars:

bist_mode(0 . . . 1) - This signal fans out from cntlr_mode(0 . . . 1).
bist_enable(0 . . . 511) - This signal is a function of the cntlr_enable and the controller TDR bits.
bist_resume - This signal fans out to all collars.
bist_rtntst - This signal fans out to all the collars.
bist_reset - This signal fans out to all the collars.

As further description, reference will be made to universal BIST controller 310, although functionality will be applicable to, and some instances described with respect to, universal BIST controller 210 and 400. With respect to inputs, the universal BIST controller 310 utilizes a conventional P1500 protocol with the inputs Tdi, SelectWIR, UpdateWR, and CaptureWR. In this example embodiment these inputs provide access to the controller TDR 401 when the SelectWIR input is a logic low, the ctlr_enable input is a logic high, and the input ctlr_mode[1:0] is set to 2'b11. By accessing the controller TDR 401 the controller can be initialized for testing in a schedule mode, enable a single collar for execution, or be setup for handling diagnostic information from the collars.

Once the controller TDR 401 is initialized for execution the cltr_mode[1:0] would switch from 2'b11 to 2'b00 or 2b10 to run using the data shifted into the controller TDR401. This sequence of events triggers the controller FSM 403 to begin execution. Then, depending on the information shifted into the controller TDR 401 as outlined in Table 1 TDR Bit Definition, the universal BIST controller 310 begins execution using the BIST Enable Decode 405 or the Scheduler FSM 406. The BIST enable decode 405 or the scheduler FSM 406 then control the BIST enable register 408 to drive the controller output signals collar_enable[511:0].

If the BIST enable decode 405 is used to drive the BIST enable register 408, a single collar is enabled from the universal BIST controller 310 output collar_enable[511:0]. From Tables above, the BEST enable decode 405 utilizes bits 5 thru 17. By setting the value associated with bits 5 thru 17 to the decimal value 1 the universal BIST controller output collar_enable [0] is asserted logic high and the remaining outputs collar_enable[511:1] are logic low. As the value assigned to bits 5 thru 17 of the controller TDR 401 increases the next collar_enable is asserted logic high and the remainder of the collar enables are set to logic low.

As BIST of the collars 320 (and therefore, memories 325) completes, the universal BIST controller 310 receives back signals indicating the status of the BIST. The status is whether BIST failed (bist_fail), BIST paused (bist_paused), BIST no fix (bist_nofix), and BIST done (bist_done). If the bist_fail is received, it indicates that BIST encountered a fail. If the bist_paused signal is received, it indicates that BIST is paused in a state whether retention testing or diagnostics (further described below) can be performed. If the bist_nofix signal is received, it indicates that a memory has more fails than can be repaired by the available spare memory locations. Finally, the bist_done signal indicates that BIST is complete.

The scheduler FSM 406 is utilized when the controller TDR 401 bits 5 thru 17 (as defined in Table 1) are set to all zeros. In this embodiment of the universal BIST controller 310 there are nine schedule mode configurations as outlined in Table 1. A number of collars can be executed in parallel to enable a predetermined number of collars 320 to test simultaneously. For example, as previously noted in one embodiment, collars 320 may be tested individually or in groups (or sets).

The collars 320 that are grouped may be divided into sets of memories, for example, each set having a power of two, such as two, four, eight, 16, 32, 64, 128, or 256 collars. If a non power-of-two number of collars 320 exist, the last serial schedule will enable the remaining collars 320. For example, consider five collars, e.g., 320a–320e (not 320b–320e not illustrated) that couple with the universal BIST controller 310 and selection of a serial mode of testing. In this example, the first four collars, 320a–320d, is initially enabled while the fifth collar, e.g., 320e, is enabled after BIST on the first four collars, e.g., 320a–320d, completes.

Note that the number of collars 320 for testing by the universal BIST controller 310 may be predetermined, e.g., already set up in the controller, or customizable, e.g., allowing selection by a user or computing algorithm. The order to test collars 320, either individually or in groups (or sets), is based on the enable signals provided through the enable module 310a. For example, the universal BIST controller 310 output signal collar_enable[511:0] may be successively ordered in terms of execution such as collar_enable[0], collar_enable[1], collar_enable[2], . . . collar_enable[n], where n is any integer value. Each enable signal is associated with a particular collar 320 that will begin test execution upon a trigger or activation of the enable signal and the assertion of the correct collar_mode[1:0].

If all collars are to be executed in parallel then the universal BIST controller 310 outputs collar BIST enables (collar_enable[511:0]) signals from the BIST enable register 408 to go logic high. Conversely, if all collars are executed serially the scheduler FSM 406 will enable a single collar for execution and upon the completion of the collar execution as signaled by the controller inputs collar_done[511:0] and/or collar_paused[511:0] the enabled collar is disabled and the next collar is enabled. This process continues until all collars have completed execution.

Similarly if a group of 2, 4, 8, 16, 32, 64, 128, or 256 collars are to be executed within a single step, the scheduler FSM 406 of the universal BIST controller 310 signals the number of collars by asserting a group of the controller output signals collar_enable[511:0]. Upon completion of the group as indicated by the associated controller inputs collar_done[511:0] or collar_paused[511:0], the universal BIST controller disables the group that was enabled and enables the next group.

The receipt of each of signals from the collars 320 in response to BIST, may be communicated off chip or elsewhere by the universal BIST controller 310. For example, the pause signals from the enabled collars will be evaluated and the universal BIST controller 310 will output a BIST pause signal (bist_paused). This signal can be communicated off chip directly using the ctlr_paused output or through access to the controller TDR 401. All of the collars 320 can be brought to the appropriate paused condition to allow a single pause for all collars on chip.

In another example, when the universal BIST controller 310 is running in schedule mode it will trigger a done signal (cntrl_done) when all groups of enabled collars 320 have completed test. If only one collar is enabled utilizing the BIST enable decode 405 then the controller done signal (cntrl_done) goes active when that particular collar is completed. Thereafter, in either case once the ctlr_done signal is asserted no collars 320 are enabled.

As noted above the collars 320 can be configured to gather more information on the failure. In one embodiment a predetermined number (e.g., four) of diagnostics may be available for use in BIST. One may be preselected or selectable for use with the collar 320. In one embodiment, the collar TDR 320h is configured to run in a diagnostic mode of operation. In this embodiment, the universal BIST controller 310 is initialized to enable a single collar 320 for execution. Examples of such diagnostics are provided below.

One example of a diagnostic is a cycle-by-cycle pass-fail indication. When this diagnostic type is utilized a BIST failure signal (bist_fail) for one memory is employed for diagnostics and goes high each time a fail is detected. In one embodiment, a TDR (e.g., TDR 230 (not shown in FIG. 3)) of an individual memory's 325 collar 320 is initialized to enable this diagnostics mode. Moreover, in this diagnostic embodiment, memories 325 may be slowly clocked.

A second example of a diagnostic is a full bit-fail map generation. This embodiment also utilizes the cycle-by-cycle pass-fail indication, but with a specific pattern where only a single data out is examined on each cycle. Failures are identified by an address, a pattern, and failing data based on a cycle number. Again, memories may be slowly clocked with this type of diagnostic. This embodiment particularly effective on memories with input/output redundancy.

A third example of a diagnostic includes a stop-on-fail. When this diagnostic is selected, an appropriate BIST pause signal (bist_paused) toggles or transitions high when a fail is detected and the collar 320 is stopped at that point. The status can be shifted out from the collar 320 thru the universal BIST controller 310 off chip. The amount of information capture and shifted off-chip may be dependent upon a size of the TDR, e.g., TDR 230, for the specific collar 320.

A fourth example of a diagnostic also has stop-on-fail capability, but includes an ability to shift out a result indicating exactly the failing bit in the memory 325. In other respects, the BIST pause signal operates similarly to the like signal in the third example of a diagnostic described above. To accommodate this mode of diagnostics the universal BIST controller 310 may include diagnostic logic to manage the data from the enabled collar 320.

It is noted that the collar 320 may be configured to be correspondingly larger to accommodate the necessary pipe stages. It is also noted that for diagnostics evaluations, the BIST environment may be configured so that only one memory is enabled or the each memory may be serially enabled for testing one after another.

Timing Overview of BIST with a Universal Bist Controller

Figure 5A:
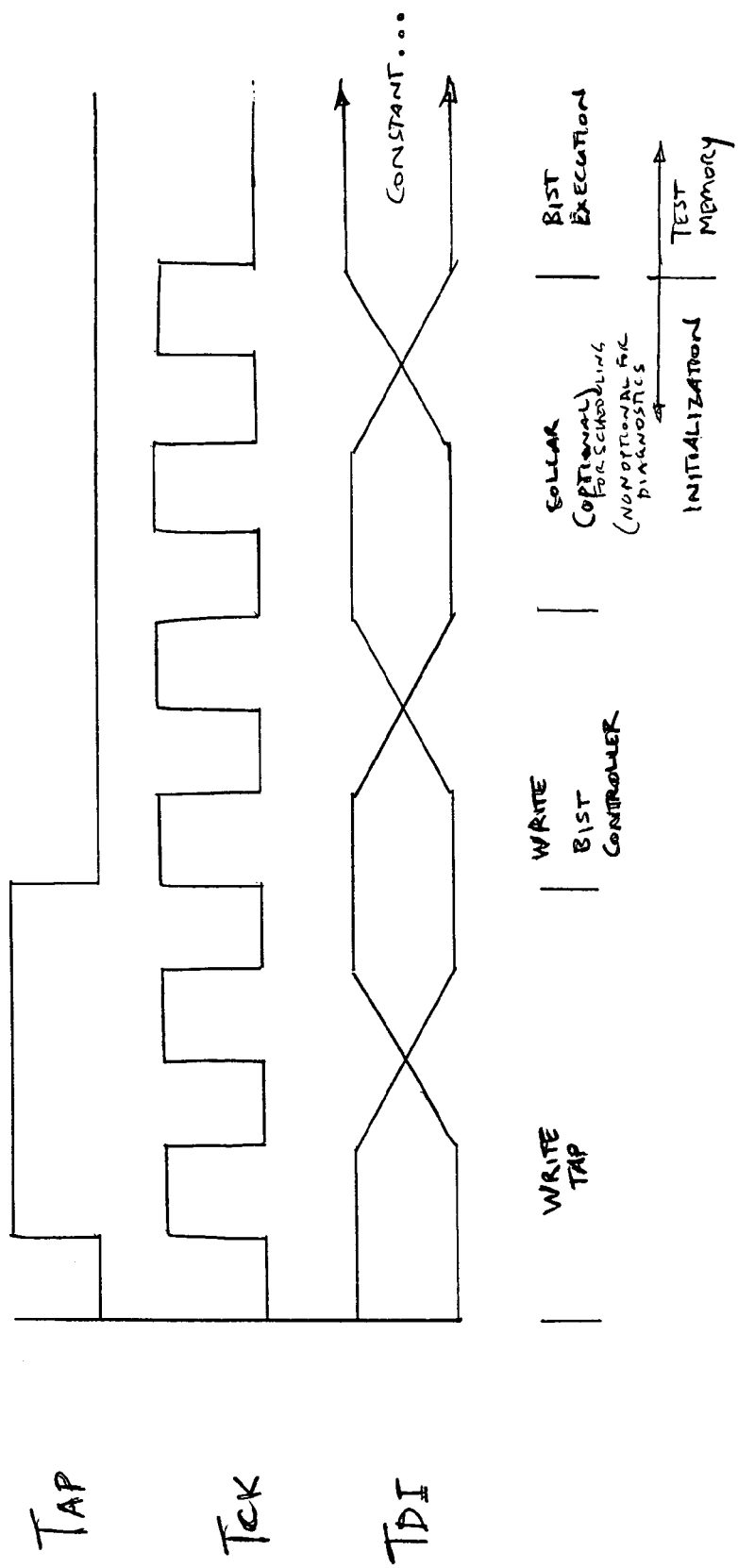
FIGS. 5a and 5b illustrate timing diagrams for signals in an integrated circuit chip BIST environment in accordance with the present invention.
Figure 5B:
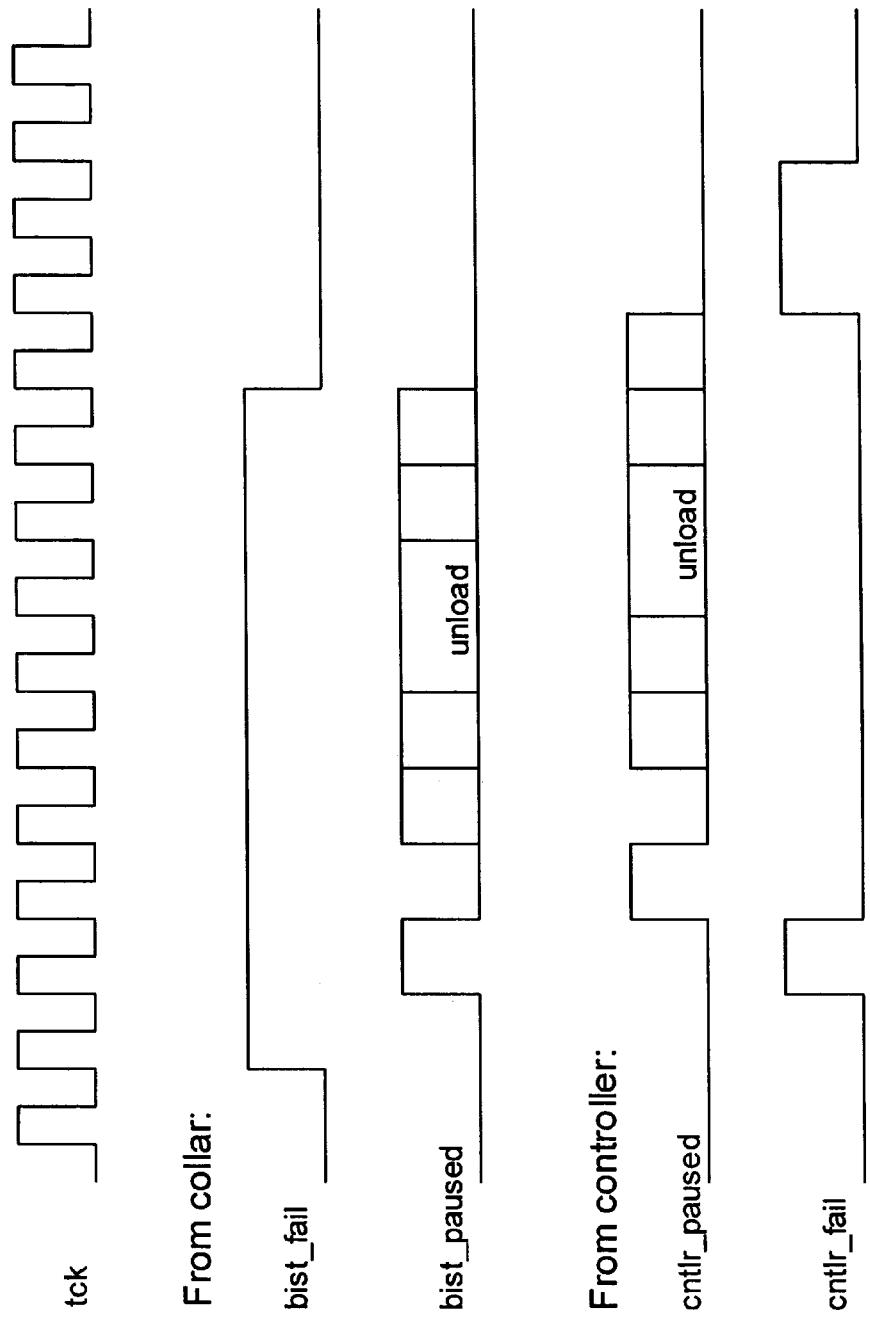

Turning now to FIGS. 5*a* and 5*b*, illustrated are timing diagrams for signals in an integrated circuit chip BIST environment in accordance with the present invention. Specifically, FIG. 5*a* illustrates an initialization phase and a BIST execution phase for the BIST environment for scheduling and diagnostics. For scheduling, the initialization phase includes writing data to the TAP, optionally to the universal BIST controller 310, and optionally the collar 320 before beginning BIST execution. For diagnostics, the initialization phase includes writing data to the TAP, the universal BIST controller 310, and to the collar 320 before beginning BIST execution.

With reference to the BIST signals from the universal BIST controller 320, it is noted that with respect to the collar 320 and the BIST operation, the universal BIST controller 310 generates a BIST retention input signal for each collar. When this input is brought to a logic high the collars 320 are enabled for retention testing. This allows default type testing with retention pauses without requiring TDR initialization of the universal BIST controller 310 or the collars 320.

The universal BIST controller 310 is also configured to allow a BIST enable signal to go to a logic low without compromising the state of the BIST. Similarly a BIST enable signal that toggles or transitions high allows BIST to continue in execution from where it left off. In addition, the collar 320 may detect a resume input signal if that collar's BIST enable signal is active. Further, a BIST reset signal is configured to operate even in instances when a BIST enable signal is a logic low. Also, a test bypass enable signal is available between the universal BIST controller 310 and the collar 320 to aid in logic test when test bypass is utilized.

As previously noted, the content of a TDR in a collar (e.g., 320) can be automatically unloaded when a fail is encountered in stop-on-fail ("SOF") mode. A TDR bit in the collar 320, identified as an auto-download mode ("ADM"), signals the collar 320 to send the TDR contents out as soon as a fail is detected and the BIST execution is brought to a halt.

FIG. 5*b* illustrates waveforms using a sequence of execution that follows. In the collar 320, when a fail is detected the BIST execution is paused. A fail signal is brought high at the collar 320, based on the rise of a test clock signal ("tck" or "TCK"). Note that because fail detection is based on the system clock 315*a*, a BIST fail signal is synchronized with the test clock 315*b*. The fail signal is the frame signal for the information to be unloaded. Next, the pause signal is brought high the following cycle then low the cycle thereafter. This pulse is a preamble to the data being unloaded. On the subsequent cycles the TDR contents in collar 320 are unloaded on a pause signal in the collar 320. The fail signal is then brought low the same cycle as the last bit of data is unloaded from the TDR in the collar 320. After at least two cycles the collar 320 is allowed to continue BIST execution.

Referring next to the controller diagnostic 310*c* (also 404) in the universal BIST controller 310, the sequence of events begins with detection of a fail so that a controller fail signal goes high for one cycle indicating the first step of an automatic unload sequence. The fail signal is the frame signal for the information to be unloaded. On the next cycle the fail signal goes low and the pause signal goes high for one cycle followed by being low for one cycle. This pulse is a preamble to the data being unloaded. The unload info then comes out of the controller pause signal output. The cycle after the last data is sent out the controller fail signal goes high for two cycles indicating the end of the unload sequence. The fail signal is the frame signal for the information to be unloaded.

The present systems and methods include a number of advantages and benefits for preparing and conducting BIST on an integrated circuit chip. For example, a universal BIST controller operates asynchronously with the memories so that the controller can operate at test clock speed (slow) while the memories are functional at system clock speed (fast or operational). This asynchronous configuration allows for a single controller to run and manage BIST for all memory types rather than having multiple controllers, one for each type of memory. This reduces signal complexity and improves testing efficiency because controller interfaces are consolidated.

Moreover, by reducing the number of controllers, the number of timing critical wires necessary to connect each controller with each collar for each different type of memory is also significantly reduced. This improves chip timing. Further, by moving memory logic elements closer to the memory and having those components operate at system clock speeds while allowing the controller to operate at test clock speed also significantly improves the ability to easily achieve and meet the circuit timing requirements during the design process. This simplifies the integration of memory BIST into the design and improves overall manufacturing efficiency.

Upon reading this disclosure, those of skill in the art will appreciate additional alternative structural and functional designs for a system and a process for a universal BIST controller and a BIST environment through the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A memory built-in self-test ("BIST") configuration on an integrated circuit chip, the configuration comprising:
    a plurality of memories, each memory having associated memory logic and at least two memories comprising memories of differing types and at least two memories comprising memories having different clock domains; and
    a controller, configured to asynchronously control testing of the plurality of memories during BIST,
    the controller further comprising,
    a scheduling element configured to group the plurality of memories into a plurality of testing sets, and configured to select a testing set of the plurality of testing sets for testing memories in the testing set in a predetermined order; and
    a diagnostic element configured to determine whether a memory in the testing set of the plurality of memories failed.

2. The configuration of claim 1, wherein the controller further comprises an enable element configured to transmit an enable signal to enable testing of a selected memory of the plurality of memories.

3. The configuration of claim 2, wherein the enable element is configured to generate an enable signal using a test signal from a test clock, the test clock configured to operate at a slower speed than a system clock.

4. The configuration of claim 3, wherein each memory and associated memory logic operate at a speed corresponding to a system clock signal from the system clock.

5. The configuration of claim 3, wherein the system clock generates a system clock signal in a range of 50 to 100 times greater than a speed of the test clock signal.

6. The configuration of claim 1, wherein memory logic for each memory further comprises logic elements configured to establish timing synchronization.

7. The configuration of claim 1, wherein the scheduling element is configured to generate a test done signal for transmitting through a test access port, the test done signal indicating testing of the plurality of memories is completed.

8. The configuration of claim 1, wherein for each memory the associated memory logic of the plurality of memories comprises a collar.

9. The configuration of claim 1, wherein the testing set comprises at least one memory.

10. The configuration of claim 1, wherein the diagnostic element is further configured to identify which memory in the testing set of the plurality of memories failed.

11. A method for conducting a built-in self-test ("BIST") for a plurality of memories in an integrated circuit chip, the plurality of memories comprising at least two memories of differing types and at least two memories having different clock domains, the plurality of memories further comprising associated memory logic, each associated memory logic comprising a collar, the method comprising:
    associating memories of the plurality of memories into a plurality of testing sets, each testing set comprising at least one memory;
    selecting a testing set of the plurality of testing sets to test each memory in the testing selected testing set;
    generating an enable signal at a slow signal speed relative to the signal operation speed of the collar, the enable signal to begin testing of a currently selected memory in the selected testing test;
    receiving a diagnostic error signal in response to the currently selected memory in the selected testing set having a failure; and
    receiving a test complete signal from the currently selected memory in response to its testing being completed.

12. The method of claim 11, further comprising generating another enable signal to test the next memory in the testing set in response to receiving the test complete signal and having to test additional memories in the selected testing set.

13. The method of claim 11, further comprising generating a BIST complete signal in response to completion of testing of each testing set of the plurality of testing sets.

14. The method of claim 11, wherein associating the memories further comprises:
    determining an order for testing the plurality of memories; and
    determining a predetermined number of memories to be tested at a time in view of at least one testing constraint.

15. The method of claim 14, wherein a testing constraint comprises power drawn by the chip.

16. The method of claim 11, wherein receiving a diagnostic error signal further comprises identifying a particular failure in the currently selected memory.

17. A system for conducting a built-in self-test ("BIST") for a plurality of memories in an integrated circuit chip, the plurality of memories comprising at least two memories of differing types and at least two memories having different clock domains, the plurality of memories further comprising associated memory logic, each associated memory logic comprising a collar, the system comprising:
    means for associating memories of the plurality of memories into a plurality of testing sets, each testing set comprising at least one memory;
    means for selecting a testing set of the plurality of testing sets to test each memory in the testing selected testing set;
    means for generating an enable signal at a slow signal speed relative to the signal operation speed of the collar, the enable signal to begin testing of a currently selected memory in the selected testing test;
    means for receiving a diagnostic error signal in response to the currently selected memory in the selected testing test having a failure; and
    means for receiving a test complete signal from the currently selected memory in response to its testing being completed.

18. The system of claim 17, wherein the means for generating generates another enable signal to test the next testing set in response to receiving the test complete signal from the currently selected testing set.

19. The system of claim 17, further comprising a means for generating a BIST complete signal in response to completion of testing of each testing set of the plurality of testing sets.

20. The system of claim 17, wherein the means for associating the memories further comprises:
    a means for determining an order for testing the plurality of memories; and a means for determining a predetermined number of memories to be tested at a time in view of at least one testing constraint.

21. The system of claim 20, wherein the means for determining an order for testing further comprises a means for determining power drawn by the chip.

22. The system of claim 17, wherein the means for receiving a diagnostic error signal further comprises a means for identifying a particular failure in the currently selected memory.

* * * * *